(12) United States Patent
Buchsbaum et al.

(10) Patent No.: US 10,423,870 B2
(45) Date of Patent: Sep. 24, 2019

(54) COMMUNICATION MODULE

(71) Applicant: Infineon Technologies AG, Neubiberg (DE)

(72) Inventors: Martin Buchsbaum, Graz (AT); Josef Gruber, St. Ruprecht an der Raab (AT); Juergen Hoelzl, Graz (AT); Frank Pueschner, Kelheim (DE); Peter Stampka, Burglengenfeld (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 388 days.

(21) Appl. No.: 14/710,689

(22) Filed: May 13, 2015

(65) Prior Publication Data

US 2015/0333397 A1 Nov. 19, 2015

(30) Foreign Application Priority Data

May 14, 2014 (DE) ........................ 10 2014 106 815

(51) Int. Cl.
*H01Q 1/50* (2006.01)
*G06K 19/073* (2006.01)
(Continued)

(52) U.S. Cl.
CPC ......... *G06K 19/073* (2013.01); *H01Q 1/2225* (2013.01); *H01Q 1/50* (2013.01);
(Continued)

(58) Field of Classification Search
CPC ........... H03J 5/14; H03K 17/10; H03K 17/60; H01Q 3/24; H01Q 1/2225; H01Q 1/50;
(Continued)

(56) References Cited

U.S. PATENT DOCUMENTS 4,647,937 A * 3/1987 Hidaka .................... H01Q 1/38
343/742
5,631,660 A * 5/1997 Higashiguchi ........... H01Q 1/38
343/700 MS
(Continued)

FOREIGN PATENT DOCUMENTS

CN 1164073 A 11/1997
CN 101060257 A 10/2007
(Continued)

OTHER PUBLICATIONS

AMS AG, "AS3922 NFC Tag Front-end with "Active Boost" Technology", Datasheet, 56pages, Revision 1.1, www.ams.com/AS3922.

(Continued)

*Primary Examiner* — Daniel Munoz
*Assistant Examiner* — Bamidele A Jegede
(74) *Attorney, Agent, or Firm* — Viering, Jentschura & Partner MBB

(57) ABSTRACT

Various embodiments provide a communication module having a carrier, a loop antenna, a modulation circuit which is coupled to the loop antenna and is configured to modulate or demodulate signals which are received or transmitted using the loop antenna, and an impedance matching circuit for matching the impedance of the loop antenna to the input impedance of the modulation circuit. The modulation circuit and the impedance matching circuit are arranged inside the loop antenna on or in the carrier.

19 Claims, 6 Drawing Sheets

(51) Int. Cl.
*H01Q 7/08* (2006.01)
*H01Q 1/22* (2006.01)
*H03H 7/38* (2006.01)
*H04B 1/40* (2015.01)
*H04B 5/00* (2006.01)

(52) U.S. Cl.
CPC ............... *H01Q 7/08* (2013.01); *H03H 7/38* (2013.01); *H04B 1/40* (2013.01); *H04B 5/0031* (2013.01)

(58) Field of Classification Search
CPC ...... H01Q 7/08; G06K 19/073; H04B 5/0031; H04B 1/40; H03H 7/38
USPC .......................................................... 343/745
See application file for complete search history.

(56) References Cited

U.S. PATENT DOCUMENTS

| | | | | |
|---|---|---|---|---|
| 5,828,044 | A | 10/1998 | Jun et al. | |
| 6,163,305 | A * | 12/2000 | Murakami | H01Q 7/08 343/788 |
| 6,232,870 | B1 * | 5/2001 | Garber | G06K 7/0008 235/385 |
| 6,243,045 | B1 * | 6/2001 | Ishibashi | G06F 13/00 343/741 |
| 6,600,452 | B2 * | 7/2003 | Junod | H01Q 7/005 343/702 |
| 7,554,501 | B2 * | 6/2009 | Park | H01Q 1/38 343/741 |
| 2001/0026244 | A1 * | 10/2001 | Ieda | H01Q 7/08 343/867 |
| 2002/0163474 | A1 * | 11/2002 | Ieda | H01Q 1/3283 343/742 |
| 2003/0054855 | A1 * | 3/2003 | Kojola | H01Q 1/084 455/550.1 |
| 2003/0067389 | A1 * | 4/2003 | Look | G06K 19/0776 340/572.1 |
| 2003/0144031 | A1 * | 7/2003 | Ono | H04B 1/0458 455/558 |
| 2004/0100407 | A1 * | 5/2004 | Okado | H01Q 1/38 343/700 MS |
| 2004/0129785 | A1 * | 7/2004 | Luu | G06K 7/0034 235/486 |
| 2004/0140360 | A1 * | 7/2004 | Deguchi | G06K 7/10336 235/451 |
| 2004/0145528 | A1 * | 7/2004 | Mukai | H01Q 1/243 343/702 |
| 2005/0030251 | A1 * | 2/2005 | Okamura | H01Q 1/2216 343/895 |
| 2006/0109191 | A1 * | 5/2006 | Shtrom | H01Q 1/38 343/795 |
| 2006/0192007 | A1 * | 8/2006 | Ide | G06K 7/0008 235/451 |
| 2007/0096881 | A1 | 5/2007 | Pillai | |
| 2007/0249398 | A1 | 10/2007 | Watanabe et al. | |
| 2007/0281549 | A1 * | 12/2007 | Liao | G06K 19/077 439/630 |
| 2008/0036673 | A1 * | 2/2008 | Yamagajo | G06K 19/07749 343/793 |
| 2008/0076475 | A1 | 3/2008 | Kim | |
| 2008/0157975 | A1 * | 7/2008 | White | B65D 55/02 340/572.7 |
| 2008/0158081 | A1 * | 7/2008 | Rofougaran | H01L 23/66 343/787 |
| 2008/0303631 | A1 * | 12/2008 | Beekley | G06F 21/79 340/5.74 |
| 2009/0058599 | A1 * | 3/2009 | Calvarese | G06K 7/0008 340/10.1 |
| 2009/0179741 | A1 * | 7/2009 | Hoyt | H04Q 9/00 340/10.1 |
| 2009/0322484 | A1 | 12/2009 | Toriyama et al. | |
| 2010/0176207 | A1 * | 7/2010 | Yoshikawa | G06K 19/077 235/492 |
| 2011/0043429 | A1 * | 2/2011 | Merlin | G06K 19/0723 343/860 |
| 2011/0171996 | A1 * | 7/2011 | Narendra | G06K 19/0701 455/558 |
| 2011/0241837 | A1 | 10/2011 | Suzuki | |
| 2012/0071090 | A1 | 3/2012 | Charrat et al. | |
| 2012/0083205 | A1 * | 4/2012 | Marcu | G06K 7/0008 455/41.1 |
| 2012/0071088 | A1 | 5/2012 | Cordier | |
| 2012/0135681 | A1 * | 5/2012 | Adams | H04B 5/0025 455/41.1 |
| 2012/0138678 | A1 * | 6/2012 | Bashan | H04M 1/026 235/380 |
| 2012/0183102 | A1 * | 7/2012 | Willingham | G01S 3/72 375/340 |
| 2013/0075477 | A1 * | 3/2013 | Finn | G06K 19/07794 235/492 |

FOREIGN PATENT DOCUMENTS

| | | |
|---|---|---|
| CN | 101615260 A | 12/2009 |
| CN | 102412872 A | 4/2012 |
| CN | 103177286 A | 6/2013 |
| DE | 69707024 T2 | 6/2002 |
| DE | 102007045611 A1 | 4/2008 |
| EP | 0783190 A1 | 7/1997 |
| EP | 0886232 A2 | 12/1998 |
| EP | 0783190 B1 | 10/2001 |
| EP | 1 908 250 B1 | 8/2010 |
| JP | 2006332758 A | 12/2006 |

OTHER PUBLICATIONS

Sony Corporation, "Sony's FeliCa/NFC technology implemented in Gemalto microSD cards", News Release information, 2014, http://www.sony.net/SonyInfo/News/Press/201402/14-025E/.

* cited by examiner

COMMUNICATION MODULE

CROSS-REFERENCE TO RELATED APPLICATION

This application claims priority to German Patent Application Serial No. 10 2014 106 815.7, which was filed May 14, 2014, and is incorporated herein by reference in its entirety.

TECHNICAL FIELD

Various embodiments relate generally to a communication module.

BACKGROUND

Mobile communication terminals, for example mobile telephones, are increasingly supporting near field communication (NFC). The functionality of near field communication can be provided in a mobile device, for example by a SIM card (generally a subscriber identity module) or a memory card, for example a microSD memory card. For this purpose, approaches are desirable which make it possible to efficiently implement NFC functionality in a module having a small form factor.

SUMMARY

Various embodiments provide a communication module having a carrier, a loop antenna, a modulation circuit which is coupled to the loop antenna and is configured to modulate or demodulate signals which are received or transmitted using the loop antenna, and an impedance matching circuit for matching the impedance of the loop antenna to the input impedance of the modulation circuit. The modulation circuit and the impedance matching circuit are arranged inside the loop antenna on or in the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following detailed description, reference is made to the accompanying drawings which form part of this description and, for the purpose of illustration, show specific embodiments in which the invention can be carried out. In this respect, direction terminology such as "at the top", "at the bottom", "at the front", "at the back", "front", "rear", etc. is used with reference to the orientation of the figure(s) described. Since components of embodiments can be positioned in a number of different orientations, the direction terminology serves for illustration purposes and is not in any way restrictive. It goes without saying that other embodiments can be used and structural or logical modifications can be made, without departing from the scope of protection of the present invention. It goes without saying that the features of the various embodiments described herein can be combined with one another unless specifically indicated otherwise. The following detailed description should therefore not be interpreted in a restrictive sense, and the scope of protection of the present invention is defined by the appended claims.

Within the scope of this description, the terms "linked", "connected" and "coupled" are used to describe both a direct and an indirect link, a direct or indirect connection and direct or indirect coupling. In the figures, identical or similar elements are provided with identical reference symbols if this is expedient.

For use in devices having a small form factor, it is possible to use an NFC (near field communication) system which can be based on a SIM (subscriber identity module) card or a microSD card.

Figure 1:
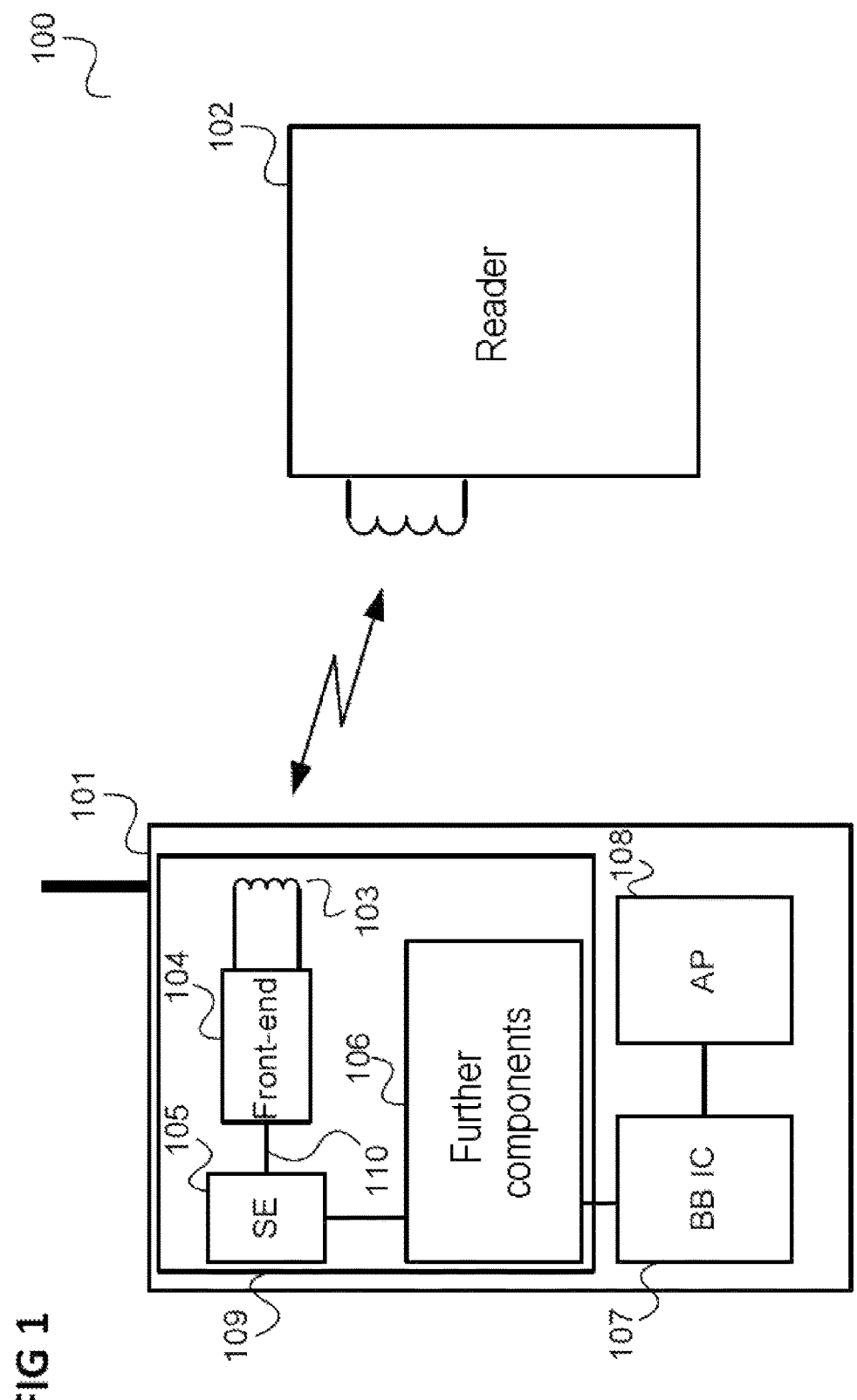
FIG. 1 shows a communication arrangement.

One example of an NFC system is illustrated in FIG. 1.

FIG. 1 shows a communication arrangement 100 according to one embodiment.

The communication arrangement 100 has a mobile telephone 101 and an (NFC) reader 102 (which is also referred to as a contactless reader).

The mobile telephone has an (NFC) antenna 103 which is coupled to a secure element (SE) 105 via an (NFC) front-end 104.

The SE 105 is coupled to further components 106, for example a flash memory or a flash controller, for example according to ISO/IEC 7816. For example, a flash controller is situated between the SE 105 and the BB-IC 107 and tunnels communication back and forth between the BB-IC 107 and the SE 105 according to ISO/IEC 7816. A flash memory is connected to the flash controller, for example, but is not connected to the SE 105 and is controlled according to a protocol other than ISO/IEC 7816, for example.

The further components 106 are coupled to mobile telephone components, a mobile telephone baseband IC 107 in this example which in turn communicates with applications executed on an application processor (AP) 108.

A signal transmitted from the reader 102 to the mobile telephone 101, for example according to ISO/IEC 14443, is amplified by the front-end 103 and is forwarded to the SE 105 via a wired interface 110 based on the ISO/IEC 14443 protocol. The interface 110 may be, for example, a DCLB (digital contactless bridge) interface or an ACLB (advanced contactless bridge) interface.

Communication between the reader 102 and the mobile telephone can also take place on the basis of other radio technologies, for example FeliCa.

The SE 105 sends a response (for example after communicating with the baseband IC 107) back to the front-end 104 which amplifies the signal received from the SE 105 using active modulation with the aid of the battery voltage present in the mobile telephone 101 and transmits it on the contactless interface between the mobile telephone 101 and the reader 102.

The further components 106, the SE 105, the front-end 104 and the antenna 103 can be arranged together, for example, on a module 109, for example a SIM card, a micro-SIM card, a nano-SIM card or a microSD card, in the mobile telephone 101 or else may be directly embedded in a printed circuit board, for example in a wristwatch. However, the difficulty exists in that case that, when implementing an NFC functionality on a module (for example a chip card) having a small form factor, the metal surroundings such as the base, battery or housing may have a highly negative effect on contactless communication.

This can be avoided by using active modulation by means of a special front-end, using a ferrite antenna component in order to adapt the radiation direction of the radio-frequency signal, or by combined antenna solutions having a ferrite antenna component and a standard antenna (that is to say a radio antenna implemented with the aid of conductor tracks) which are implemented directly on the printed circuit board of the corresponding module. The active modulation may also be part of the functionality of the SE 105, with the result that it is possible to dispense with the front-end 104 and the interface 110.

However, the design of these approaches requires a profound understanding of RFID technology (for example the transmission path) from the module manufacturer, for example microSD or mini-/micro-/nano-SIM providers.

Only short ranges of contactless communication (for example less than 2 cm) can sometimes be achieved. However, integration with very good performance of contactless communication typically requires a very large amount of effort (and very intensive cooperation with the module manufacturer for the target form factor). In addition, module manufacturers (for example microSD manufacturers) typically require contactless test systems in order to verify the product (module).

According to one embodiment, the components of the NFC system, for example the antenna, the matching circuit, the front-end (generally modulation circuit) and the secure element, are fully integrated.

Figure 2:
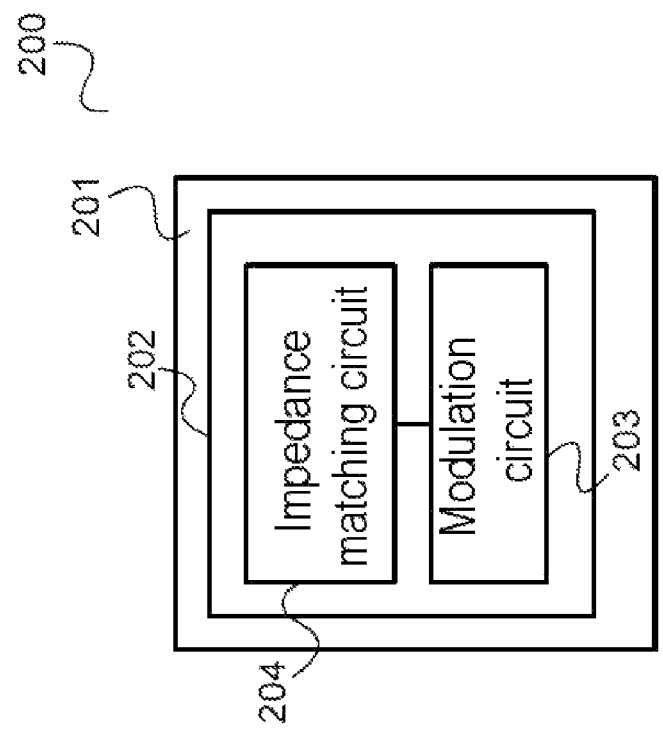
FIG. 2 shows a communication module according to one embodiment.

FIG. 2 shows a communication module 200 according to one embodiment.

The communication module 200 has a carrier 201, a loop antenna 202 and a modulation circuit 203 which is coupled to the loop antenna and is intended to modulate or demodulate signals which are received or transmitted using the loop antenna 202.

The communication module 200 also has an impedance matching circuit 204 for matching the impedance of the loop antenna 202 to the input impedance of the modulation circuit 203.

The modulation circuit 203 and the impedance matching circuit 204 are arranged inside the loop antenna 202 on or in the carrier 201.

In other words, the components of the NFC system are (fully) integrated together in or on a carrier, the modulation circuit (for example the front-end), the impedance matching circuit and also a processor (for example a secure element), for example, being arranged in the carrier surface (in and/or on the carrier) surrounded by the loop antenna. A module (for example a SIM card or a microSD card) can therefore be provided with an NFC system using an individual component. Special knowledge of contactless communication is therefore not required from the manufacturer of the module and can remain with the communication module manufacturer. The communication module can also be installed directly (that is to say without arranging it in a module) in a communication device, for example a smartphone, for example on a printed circuit board of the communication device. For this purpose, it is also not necessary for the manufacturer of the communication device to have special knowledge of NFC communication. Furthermore, the manufacturer of the module or of the communication device does not need any test systems for contactless communication.

According to one embodiment, a matching network (for example between the loop antenna and the modulation circuit) is integrated and optimized. Furthermore, the directivity of the antenna signal can be optimized. Integration can also achieve the best possible combination of a PCB (printed circuit board) antenna, that is to say a radio antenna implemented in or on a printed circuit board (generally a carrier) with the aid of conductor tracks, and a ferrite antenna with regard to the performance of contactless communication.

Furthermore, the amount of space needed by the components of the NFC system can be reduced. In addition, it is possible to avoid the secure element being easily replaced, as in a non-integrated approach.

The components of the NFC system can be arranged in the communication module in such a manner that interference of the antenna signal by components such as the matching circuit, the modulation circuit and the processor is at least partially avoided.

According to one embodiment, the communication module also has a processor which is coupled to the modulation circuit, with the modulation circuit, the impedance matching circuit and the processor being arranged inside the loop antenna on or in the carrier. The communication module may also be a purely active modulation module without a processor.

The processor has, for example, a cryptoprocessor, for example for carrying out cryptographic algorithms.

According to one embodiment, the communication module also has a ferrite core antenna structure which is coupled to the impedance matching circuit, the impedance matching circuit being set up to match the impedance of the ferrite core antenna structure to the input impedance of the modulation circuit, and the ferrite core antenna structure being arranged inside the loop antenna on the carrier. The ferrite core antenna structure need not be a completely integrated component but rather is formed from a ferrite and structured conductor tracks, for example.

The impedance matching circuit has, for example, at least one SMD (surface mounted device) circuit and/or at least one embedded circuit. The impedance matching circuit may have, for example, a component embedded in a carrier (embedded component).

The loop antenna is, for example, a PCB (printed circuit board) loop antenna.

The communication module may also have an energy supply interface, for example for supplying energy to the communication module by means of the mobile device, for example for receiving energy from a battery of a mobile device. The energy supply interface is, for example, part of an interface to the outside (that is to say to one or more components outside the communication module) which has connections for the energy supply but may also include, for example, an ISO 7816 interface (for example corresponding to the interface 306 illustrated in FIG. 3).

The communication module may also have a 7816 interface.

The communication module may also have an SPI (serial peripheral interface) interface.

The modulation circuit is, for example, an NFC front-end.

The impedance matching circuit is, for example, an impedance matching network.

According to one embodiment, the communication module is set up for NFC (near field communication) communication.

For example, the communication module is set up for battery-assisted communication.

One embodiment provides a subscriber identity module having a communication module as described above.

The subscriber identity module is, for example, a SIM card.

One embodiment provides a memory card, e.g. a microSD memory card, having a communication module as described above.

One embodiment provides a communication device (for example an electronic device which can be worn on the body such as a wristwatch) having an embedded communication module as described above.

Various embodiments are explained in more detail below.

Figure 3:
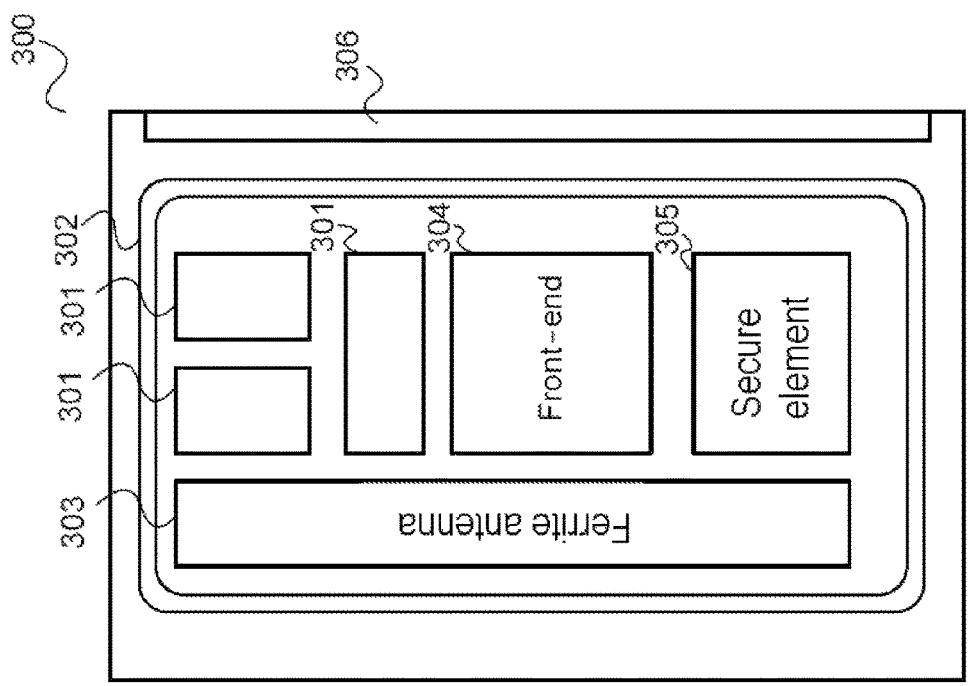
FIG. 3 shows a plan view of a communication module according to one embodiment.

FIG. 3 shows a communication module 300.

The communication module 300 is configured, for example, in such a manner that it can be used in a microSD card or a mini-/micro-SIM card.

In this embodiment, the communication module 300 has a matching network in the form of SMD (surface mounted device) components 301. In another embodiment, the matching network may also be provided in the form of one or more components embedded in a carrier. The communication module 300 has a PCB antenna 302 as well as an integrated ferrite antenna 303, a front-end 304 and a secure element 305.

The communication module 300 also has an interface circuit 306 which provides an ISO 7816 interface and/or an SPI interface, for example.

The communication module may be arranged in the module 109 instead of the antenna 103, the front-end 104 and the secure element 105, for example.

Alternatively, it can be directly arranged in the mobile telephone 101 (or a device which can be worn on the body, for example a wristwatch), for example on a printed circuit board of the mobile telephone 101 on which the baseband IC 107 and the processor 108 are also arranged. In this case, a module without an NFC system can be used in the mobile telephone 101.

The communication module can communicate with the further components 106 and/or the baseband IC 107, for example, by the interface circuit 306.

The communication module 300 has a carrier (for example a printed circuit board), and the different components 301 to 305 of the communication module 300 may be arranged or embedded on and/or in the carrier.

Different possibilities are described below with reference to FIG. 4 and FIG. 5.

Figure 4:
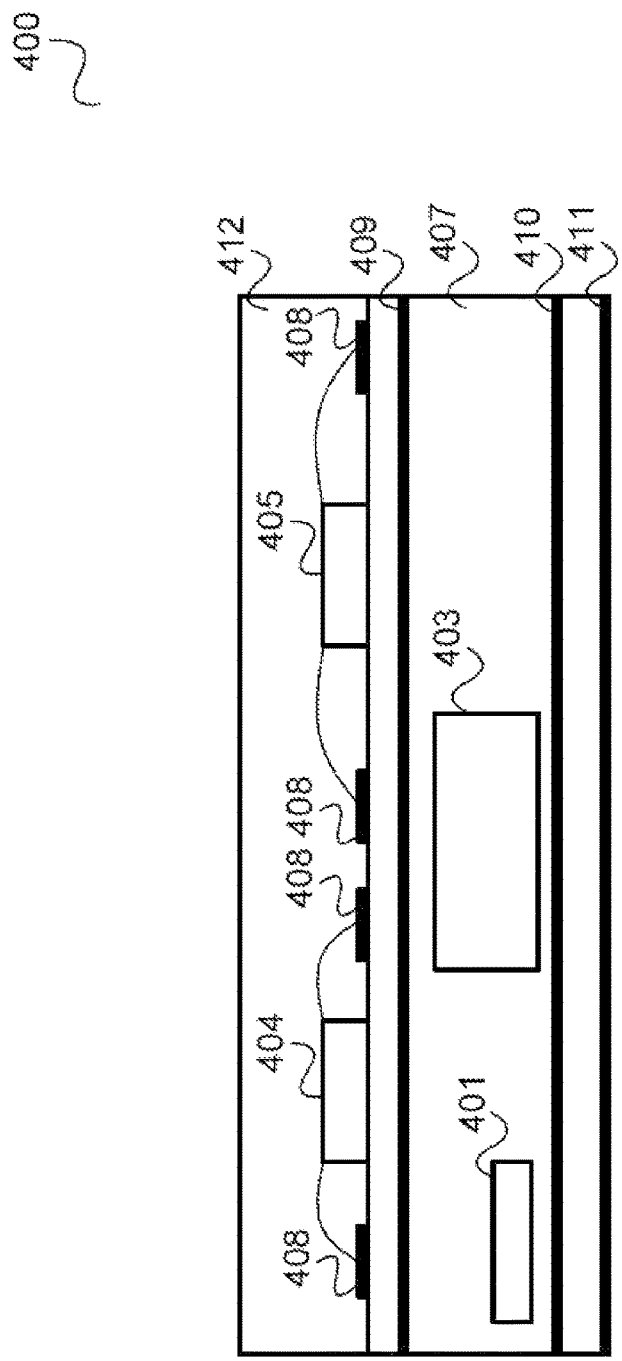
FIG. 4 shows a cross section through a communication module according to one embodiment.

FIG. 4 shows a communication module 400.

In this example, the front-end 404 and the secure element 405 are arranged on the carrier 407 by means of bonding, whereas the matching network in the form of one or more matching components 401 and the ferrite antenna 403 are embedded in the carrier (substrate) 407.

Pads 408 for bonding the front-end 404 and the secure element 405 are formed on the carrier 407 by means of a first copper layer. The carrier 407 also has a second copper layer 409 and a third copper layer 410 which are used to connect the different components and from which the PCB antenna 302 and the ferrite antenna 303 are formed (by means of appropriate structuring). The communication module 400 has a fourth copper layer 411 which is used to form contacts for the interface(s) provided by the interface circuit 306.

According to another embodiment, the second copper layer 409 and the third copper layer 410 are dispensed with. In this case, the PCB antenna 302 and the ferrite antenna can be formed by the first copper layer and the fourth copper layer.

The front-end 404 and the secure element 405 are encapsulated by encapsulating material 412, for example plastic.

Figure 5:
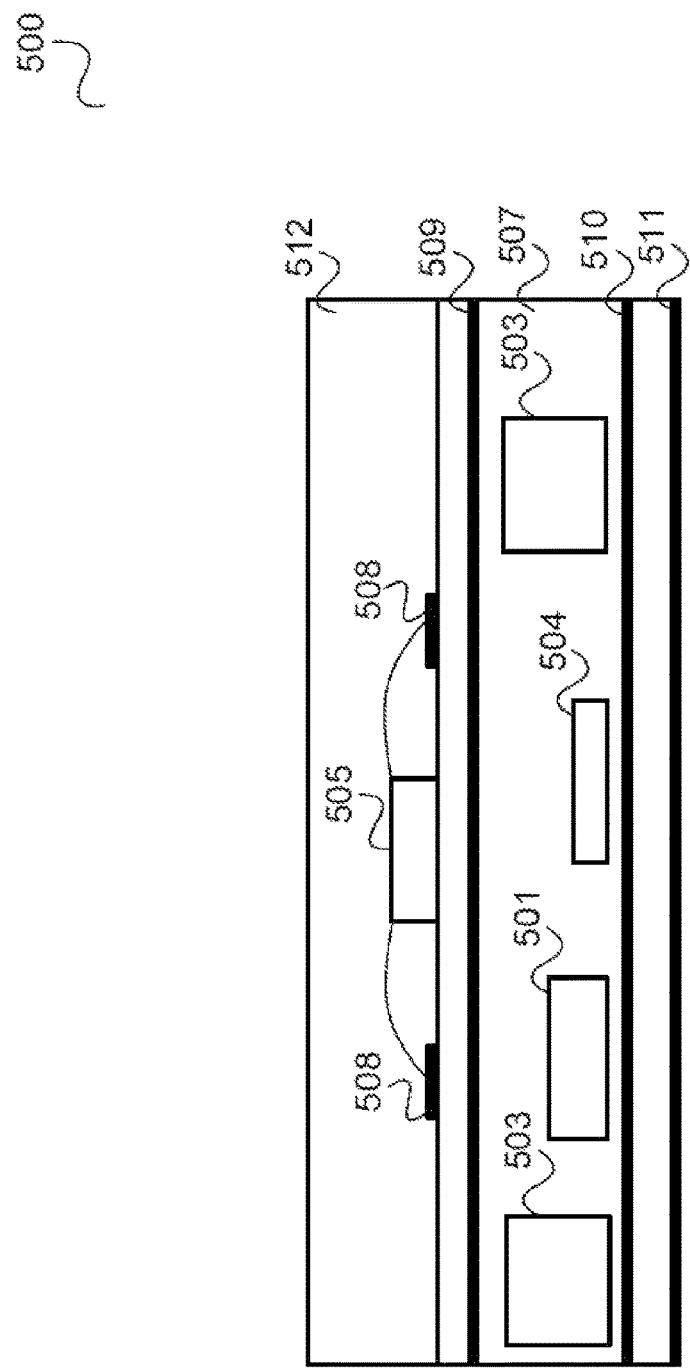
FIG. 5 shows a cross section through a communication module according to another embodiment.

FIG. 5 shows a communication module 500.

In this example, only the secure element 505 is arranged on the carrier 507 by means of bonding, whereas the matching network in the form of one or more matching components 501, the ferrite antenna (two small ferrite plates 503 in this example) and the front-end 504 are embedded in the carrier (substrate) 507.

In this example too, pads 508 for bonding the secure element 505 are formed on the carrier 507 using a first copper layer. As in the example from FIG. 4, there may be one or more further copper layers 509 which form the PCB antenna 302, for example.

The secure element 505 is encapsulated using encapsulating material 512, for example plastic.

According to another embodiment, all components, that is to say also the secure element, can be arranged inside the carrier (substrate). It is accordingly possible to dispense with the encapsulating material 512.

The communication module 400, 500 has a thickness of 600 µm to 800 µm, for example, with the carrier 407, 507 having a thickness of 500 µm to 600 µm, for example, and the ferrite antenna having a thickness of 250 µm, for example.

Figure 6:
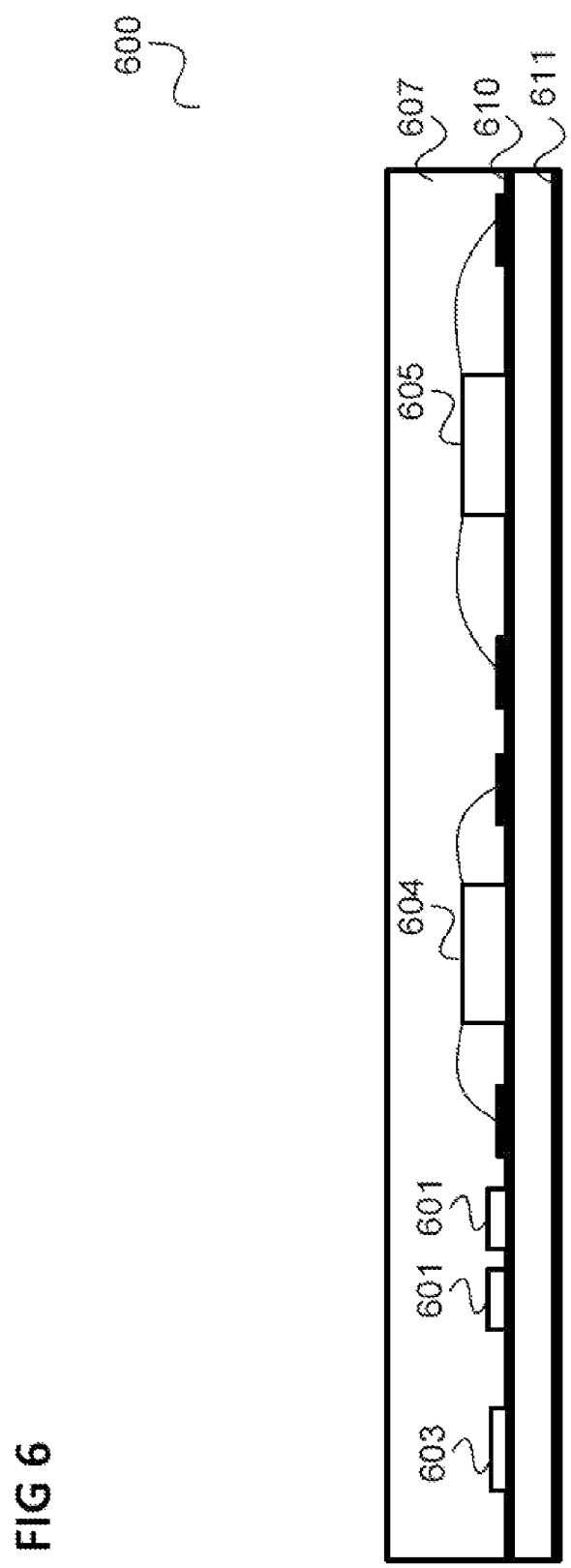
FIG. 6 shows a cross section through a communication module according to another embodiment.

Another example of a communication module is illustrated in FIG. 6.

FIG. 6 shows a communication module 600.

In this example, the front-end 604 and the secure element 605 are arranged on a (thin) printed circuit board 609 by bonding.

The printed circuit board 609 has a first metal layer 610 (metallization) on its top side and a second metal layer 611 (metallization) on its underside. The front-end 604 and the secure element 605 are bonded to the first metal layer 610.

The matching network is provided in the form of a plurality of SMD components 601 which are soldered to the first metal layer 610.

An SMD ferrite antenna component 603 is also provided on the first metal layer 610.

The components 601, 603, 604, 605 are potted in an encapsulating material 607.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A communication module, comprising: a printed circuit board;
a loop antenna;
a modulation circuit coupled to the loop antenna and is configured to modulate or demodulate signals received or transmitted using the loop antenna; and
an impedance matching circuit for matching the impedance of the loop antenna to the input impedance of the modulation circuit;
wherein the modulation circuit and the impedance matching circuit are arranged inside the loop antenna and within the printed circuit board;
a ferrite core antenna structure coupled to the impedance matching circuit;
wherein the impedance matching circuit is configured up to match the impedance of the ferrite core antenna structure to the input impedance of the modulation circuit;
wherein the ferrite core antenna structure is arranged inside the loop antenna within the printed circuit board.

2. The communication module of claim 1, further comprising:
a processor coupled to the modulation circuit, with the modulation circuit, the impedance matching circuit and the processor being arranged inside the loop antenna on or within the printed circuit board.

3. The communication module of claim 2,
the processor comprising a cryptoprocessor.

4. The communication module of claim 1,
wherein the impedance matching circuit comprises at least one of at least one SMD circuit or at least one embedded circuit.

5. The communication module of claim 1,
wherein the loop antenna is a printed circuit board (PCB) loop antenna.

6. The communication module of claim 1, further comprising:
an energy supply interface.

7. The communication module of claim 1, further comprising:
a 7816 interface.

8. The communication module of claim 1, further comprising:
an SPI interface.

9. The communication module of claim 1,
wherein the modulation circuit is an NFC front-end.

10. The communication module of claim 1,
wherein the impedance matching circuit is an impedance matching network.

11. The communication module of claim 1,
being configured for NFC communication.

12. The communication module of claim 1,
being configured for battery-assisted communication.

13. The communication module of claim 1, wherein the processor is arranged within the printed circuit board.

14. A subscriber identity module, comprising:
a communication module, comprising:
a printed circuit board;
a loop antenna;
a modulation circuit coupled to the loop antenna and is configured to modulate or demodulate signals received or transmitted using the loop antenna;
an impedance matching circuit for matching the impedance of the loop antenna to the input impedance of the modulation circuit; and
a ferrite core antenna structure coupled to the impedance matching circuit;
wherein the modulation circuit, the ferrite core antenna structure, and the impedance matching circuit are arranged inside the loop antenna, and within the printed circuit board.

15. The subscriber identity module of claim 14,
wherein the subscriber identity module is a subscriber identity module card.

16. A memory card, comprising:
a communication module, comprising:
a printed circuit board;
a loop antenna;
a modulation circuit coupled to the loop antenna and is configured to modulate or demodulate signals received or transmitted using the loop antenna;
an impedance matching circuit for matching the impedance of the loop antenna to the input impedance of the modulation circuit; and
a ferrite core antenna structure coupled to the impedance matching circuit;
wherein the modulation circuit, the ferrite core antenna, and the impedance matching circuit are arranged inside the loop antenna, and within the printed circuit board.

17. The memory card of claim 16,
wherein the memory card is a micro SD memory card.

18. A communication device, comprising:
an embedded communication module, comprising:
a printed circuit board;
a loop antenna;
a modulation circuit coupled to the loop antenna and is configured to modulate or demodulate signals received or transmitted using the loop antenna;
an impedance matching circuit for matching the impedance of the loop antenna to the input impedance of the modulation circuit; and
a ferrite core antenna structure coupled to the impedance matching circuit;
wherein the modulation circuit, the ferrite core antenna structure, and the impedance matching circuit are arranged inside the loop antenna, and within the printed circuit board.

19. The communication device of claim 18, wherein the loop antenna, the impedance matching circuit, the ferrite core antenna, and the modulation circuit are encapsulated in an encapsulation material.

* * * * *